(12) United States Patent
Lyu

(10) Patent No.: US 11,127,829 B2
(45) Date of Patent: Sep. 21, 2021

(54) SEMICONDUCTOR DEVICE

(71) Applicant: NANJING SINNOPOWER TECHNOLOGY CO., LTD., Jiangsu (CN)

(72) Inventor: Xinjiang Lyu, Jiangsu (CN)

(73) Assignee: Nanjing Sinnopower Technology Co., Ltd., Jiangsu (CN)

( * ) Notice: Subject to any disclaimer, the term of this patent is extended or adjusted under 35 U.S.C. 154(b) by 0 days.

(21) Appl. No.: 16/641,584

(22) PCT Filed: Jul. 26, 2018

(86) PCT No.: PCT/CN2018/097167
§ 371 (c)(1),
(2) Date: Feb. 24, 2020

(87) PCT Pub. No.: WO2019/042052
PCT Pub. Date: Mar. 7, 2019

(65) Prior Publication Data
US 2020/0227527 A1 Jul. 16, 2020

(30) Foreign Application Priority Data
Aug. 29, 2017 (CN) .......................... 201710757159.1

(51) Int. Cl.
*H01L 29/423* (2006.01)
*H01L 29/06* (2006.01)
(Continued)

(52) U.S. Cl.
CPC ...... *H01L 29/4236* (2013.01); *H01L 29/0607* (2013.01); *H01L 29/1095* (2013.01);
(Continued)

(58) Field of Classification Search
CPC ............ H01L 29/4236; H01L 29/0607; H01L 29/1095; H01L 29/7395; H01L 29/7412;
(Continued)

(56) References Cited

U.S. PATENT DOCUMENTS 8,384,194 B2    2/2013  Hsieh
2011/0233684 A1 9/2011  Matsushita
2017/0025522 A1* 1/2017 Naito .................... H01L 29/407

FOREIGN PATENT DOCUMENTS

CN    101582443 A    11/2009
CN    104078497 A    10/2014
(Continued)

OTHER PUBLICATIONS

International Search Report and Written Opinion issued in PCT/CN2018/097167 dated Nov. 5, 2018, 7 pages.

*Primary Examiner* — Syed I Gheyas
(74) *Attorney, Agent, or Firm* — Foley & Lardner, LLP

(57) ABSTRACT

A semiconductor device comprises at least one cell. The structure of each cell comprises: a N-type substrate; at least one first trench unit and at least one second trench unit provided on one side of the N-type substrate; at least one P-type semiconductor region provided on the other side of the N-type substrate, the P-type semiconductor region consisting an anode region; at least one N-type carrier barrier region; and at least one P-type electric field shielding region. The purpose of the present invention is to provide a semiconductor device which has a novel cell structure to provide: a large safe operating area; a short-circuit resistance; elimination of the effect of parasitic thyristors; a low gate-collector charge ($Q_{GC}$) to provide a maximum resistance to dv/dt; increase of conductivity modulation at the emitter side to provide a large current density and an extremely low on-voltage drop; a small turn-off loss; and a low process complexity.

12 Claims, 17 Drawing Sheets

(51) Int. Cl.
*H01L 29/10* (2006.01)
*H01L 29/739* (2006.01)
*H01L 29/74* (2006.01)
*H01L 29/744* (2006.01)

(52) U.S. Cl.
CPC ........ *H01L 29/7395* (2013.01); *H01L 29/744* (2013.01); *H01L 29/7412* (2013.01)

(58) Field of Classification Search
CPC ....... H01L 29/744; H01L 29/06; H01L 29/73; H01L 29/739; H01L 29/0657; H01L 29/7393
See application file for complete search history.

(56) References Cited

FOREIGN PATENT DOCUMENTS

| | | |
|---|---|---|
| CN | 204668313 U | 9/2015 |
| DE | 10 2012 222 439 A1 | 6/2013 |
| EP | 3 147 950 A1 | 3/2017 |
| JP | 2007-074006 | 3/2007 |
| JP | 2009-277792 | 11/2009 |
| JP | 2011-204803 | 10/2011 |
| JP | 2017-028250 | 2/2017 |
| JP | 2019-012762 | 1/2019 |

\* cited by examiner

SEMICONDUCTOR DEVICE

CROSS-REFERENCE TO RELATED APPLICATIONS

This application is a national stage entry under 35 U.S.C. § 371 of International Patent Application No. PCT/CN2018/097167 filed Jul. 26, 2018, which in turn claims priority to Chinese Application No. 201710757159.1, filed Aug. 29, 2017, the entire content of each of which is hereby incorporated by reference.

TECHNICAL FIELD

The present invention relates to the field of semiconductor technology, and in particular, to a semiconductor device.

BACKGROUND

Insulated gate bipolar transistor (IGBT) is a composite fully-controlled voltage-driven power semiconductor device consisted of a metal-oxide-semiconductor (MOS) field effect transistor and a bipolar junction transistor (BJT), having the advantages of high input impedance, small driving power, simple driving circuit, fast switching speed and low on-voltage drop, etc. It has been extremely widely used in the fields of household appliances, rail transits, smart grids, aerospace, electric vehicles and new energy equipment, and constitutes the core device for power conversion and transmission.

As a core device in the power electronics technology, an IGBT must not only work in the rated state, but also withstand the extreme conditions that often occur in power systems, such as overvoltage, overcurrent, and high voltage and current change rates (dv/dt, di/dt). Therefore, the stability and reliability of the IGBT is particularly important for the circuit system.

Various factors could cause an IGBT failure, in which the main one is going beyond the safe operating area (SOA). The mechanism of a failure can generally be attributed to the following aspects: 1) failure caused by parasitic thyristor latch-up; 2) failure caused by exceeding the maximum junction temperature due to self-heating of the device under high voltage and high current; 3) failure caused by gate out-of-control under high dv/dt conditions due to the presence of gate-collector capacitance ($C_{GC}$), or caused by breakdown of oxide layer due to excessive gate potential; 4) failure caused by the device's actual voltage exceeding its maximum voltage tolerance under high di/dt conditions due to the presence of loop parasitic inductance.

Therefore, it is necessary to provide a novel device structure to reduce or even completely avoid the influence of the above factors on the reliability.

SUMMARY

The purpose of the present invention is to solve the above technical problems by providing a semiconductor device which has a novel cell structure, in order to provide: (1) a large safe operating area; (2) a large short-circuit withstand time; (3) elimination of the effect of parasitic thyristors; (4) a low gate-collector charge ($Q_{GC}$) to provide a maximum resistance to dv/dt; (5) increase of conductivity modulation at the emitter side to provide a large current density and an extremely low on-voltage drop; (6) a low turn-off loss; and (7) a low process complexity.

To achieve this purpose, the present invention provides a semiconductor device comprising at lease one cell, each cell having a structure comprising: a N-type substrate; at least one first trench unit and at least one second trench unit provided on one side of the N-type substrate; at least one P-type semiconductor region provided on the other side of the N-type substrate, the P-type semiconductor region constituting an anode region; at least one N-type carrier barrier region having a doping concentration higher than that of the N-type substrate; and at least one P-type electric field shielding region; wherein the N-type carrier barrier region is provided with a surface in direct contact with the first trench unit, the N-type carrier barrier region is further provided with a surface in direct contact with the second trench unit, and the P-type electric field shielding region is provided with a surface in direct contact with the second trench unit; a gate region is provided within the first trench unit, with a first dielectric being provided between the gate region and semiconductor material for isolation, while a cathode region is provided within the second trench unit, with a second dielectric being provided between the cathode region and semiconductor material for isolation; the semiconductor device comprises at least one first electrode and at least one second electrode; the P-type semiconductor region is provided with a surface in direct contact with the first electrode; the cathode region is connected with the second electrode; and a third dielectric is provided between at least one gate region and the second electrode for isolation, this gate region consisting a third electrode of the semiconductor device.

Preferably, the first trench unit may have a width equal to that of the second trench unit, or the first trench unit may have a width not equal to that of the second trench unit; and the first trench unit has a depth less than or equal to that of the second trench unit.

Preferably, at least one floating P-type semiconductor region is provided on a side of the N-type substrate, and a fourth dielectric is provided between the floating P-type semiconductor region and the second electrode for isolation.

Preferably, a first N-type semiconductor region is provided between the P-type semiconductor region and the N-type substrate, the N-type semiconductor region consisting a field stop region.

Preferably, the N-type substrate is connected with the first electrode through a second N-type semiconductor region.

Preferably, the cell comprises two or more first trench units, and at least one first gate or second gate is connected with the second electrode.

Preferably, the cell comprises two or more second trench units, and at least two P-type electric field shielding regions are in contact with each other.

Preferably, the semiconductor device is a MOS-controlled bipolar transistor, and a P-type source body region is provided between the first trench unit and the second trench unit; the P-type source body region is provided with at least one N-type electron source region on a side adjacent to the first trench unit; at least a part of the P-type source body region and a part of the N-type electron source region are connected with the second electrode; and the first trench unit, the N-type carrier barrier region, the P-type source body region, and the N-type electron source region constitute a MOS structure.

Preferably, the semiconductor device is a MOS controlled thyristor.

Preferably, the semiconductor device is a diode.

Preferably, the semiconductor device is a Shockley diode.

Preferably, the semiconductor device is a thyristor whose gate can be turned off.

Preferably, the N-type and P-type are interchangeable.

The purpose of the present invention is to provide a semiconductor device, which has a novel cell structure to provide: (1) a large safe operating area; (2) a large short-circuit withstand time; (3) elimination of the effect of parasitic thyristors; (4) a low gate-collector charge ($Q_{GC}$) to provide a maximum resistance to dv/dt; (5) increase of conductivity modulation at the emitter side to provide a large current density and an extremely low on-voltage drop; (6) a low turn-off loss; and (7) a low process complexity.

Figure 1:
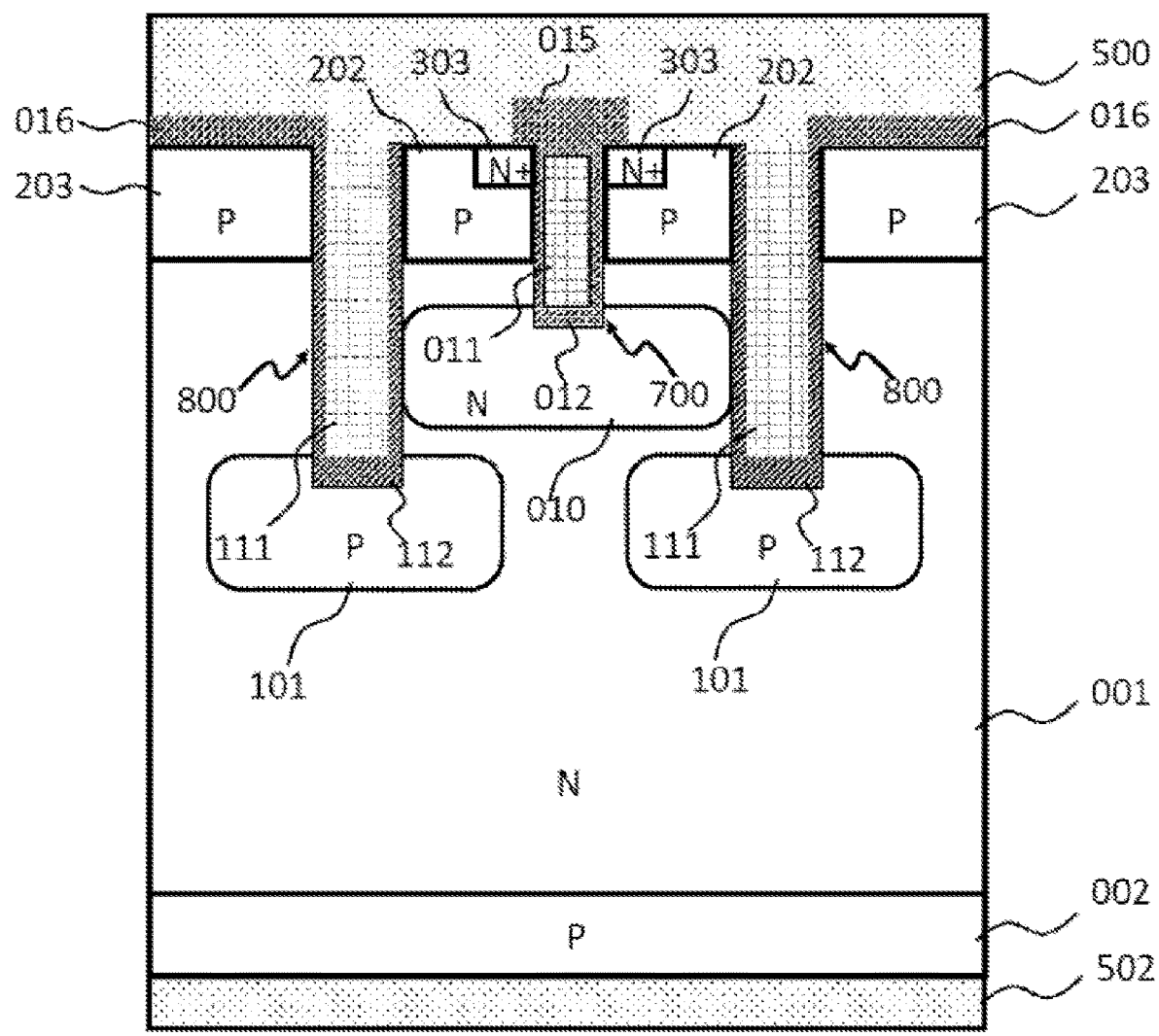
FIG. 1 is a schematic diagram of an embodiment of the present invention.

List of reference numbers: N-type substrate 001; P-type semiconductor region 002; first N-type semiconductor region 003; second N-type semiconductor region 004; N-type carrier barrier region 010; gate region 011; first dielectric 012; third dielectric 015; fourth dielectric 016; first gate 017; second gate 021; P-type electric field shielding region 101; cathode region 111; second dielectric 112; first P-type region 113; P-type source body region 202; floating P-type semiconductor region 203; P-type region 205; N-type region 207; third N-type semiconductor region 302; N-type electron source region 303; first electrode 502; second electrode 500; conductor 600; first trench unit 700; second trench unit 800.

DETAILED DESCRIPTION OF THE INVENTION

The embodiments of the present invention will be further described in combination with the drawings and the following detailed descriptions.

Example 1

The MOS-controlled bipolar transistor (MCBT) proposed by the present invention is consisted of a plurality of cell units, and FIG. 1 shows a schematic cross-sectional structure diagram of one of the cells. The cell structure uses an N-type substrate 001 as a substrate. A P-type semiconductor region 002 is provided on one side of the N-type substrate 001, which consists an anode region. At least one first trench unit 700 and at least one second trench unit 800 are provided on the other side of the N-type substrate 001, wherein the depth of the first trench unit 700 is smaller than that of the second trench unit 800. An N-type carrier barrier region 010 having a higher doping concentration than that of the N-type substrate 001 is provided at the bottom of the first trench unit 700, and consists a minority carrier barrier region. A P-type electric field shielding region 101 is provided at the bottom of the second trench unit 800. A gate region 011 is provided within the first trench unit 700, and a first dielectric 012 is provided between the gate region 011 and the N-type substrate 001 for isolation. A cathode region 111 is provided within the second trench unit 800, and second dielectric 112 is provided between the cathode region 111 and the N-type substrate 001 for isolation. One side of the N-type carrier barrier region 010 is in contact with the second dielectric 112 of the second trench unit 800. A P-type source body region 202 is provided between the first trench unit 700 and the second trench unit 800, and an N-type electron source region 303 is provided inside the P-type source body region 202 and on the side immediately adjacent to the first trench unit 700. A floating P-type semiconductor region 203 is provided outside the first trench unit 700 and the second trench unit 800. A first electrode 502 of a metal material covers the P-type semiconductor region 002, consisting a collector of the MCBT; a second electrode 500 of a metal material covers at least part of the cathode region 111, at least part of the P-type source body region 202, and at least part of the N-type electron source region 303, consisting an emitter of the MCBT; and the gate region 011 consists the gate of the MCBT. A third dielectric 015 is provided between the gate region 011 and the second electrode 500 for isolation; and a fourth dielectric 016 is provided between the floating P-type semiconductor region 203 and the second electrode 500 for isolation.

Further, the first trench unit 700, the N-type carrier barrier region 010, the P-type source body region 202, and the N-type electron source region 303 constitute an N-MOS structure, where the N-type electron source region 303 is the source region of electrons of the N-MOS, and the N-type carrier barrier region 010 is the drain region of the electrons of the N-MOS.

Furthermore, the second trench unit 800, the P-type source body region 202, the N-type carrier barrier region 010, and the P-type electric field shielding region 101 constitute a P-MOS structure, where the P-type electric field shielding region 101 is the source region of the holes of the P-MOS, and the P-type source body region 202 is the drain region of the holes of the P-MOS.

Furthermore, the P-type semiconductor region 002, the N-type substrate 001, and the P-type electric field shielding region 101 constitute a PNP bipolar transistor, where the P-type semiconductor region 002 is the minority emitter of the PNP transistor, the P-type electric field shielding region 101 is the minority collector region of the PNP transistor, and the N-type substrate 001 is the base region of the PNP transistor.

The main electrical characteristics of the MOS-controlled bipolar transistor (MCBT) provided by the present invention are described below with the embodiment shown in FIG. 1.

First, the MCBT provided by the present invention has an extremely low on-voltage drop $V_{ON}$. When the voltage $V_{CE}$ between the first electrode 502 and the second electrode 500 of the MCBT is greater than zero, and the voltage $V_{GE}$ between the gate region 011 and the second electrode 500 exceeds the threshold voltage $V_{THN}$ of the N-MOS, then there are electrons starting from the N-type electron source region 303, flowing successively through the P-type source body region 202, the N-type carrier barrier region 010, and the N-type substrate 001, and reaching the P-type semiconductor region 002. At the same time, there are holes starting from the P-type semiconductor region 002, flowing through the N-type substrate 001, and reaching the P-type electric field shielding region 101. It is worth mentioning that a built-in potential caused by the concentration difference exists between the N-type substrate 001 and the N-type carrier barrier region 010 having a higher doping concentration, the built-in potential constituting a potential barrier for the holes in the N-type substrate 001, which hinders the flow of holes to the P-type source body region 202, so that the hole concentration within the N-type substrate 001 is significantly increased near the N-type carrier barrier region 010 and a strong conductivity modulation is formed, whereby the current density of the device is greatly increased. On the other hand, at the same current density, the MCBT has a lower on-voltage drop $V_{ON}$ than IGBT.

Second, the MCBT provided by the present invention has an extremely high latch-up resistance. In practical applications, power semiconductor devices often work in certain extreme situations such as high voltage and high current. At this time, a large amount of holes are injected from the P-type semiconductor region 002 into the N-type substrate 001 and reach the P-type electric field shielding region 101. The positively charged holes enter the P-type electric field shielding region 101 so that the potential of this region is increased. When the potential of the P-type electric field shielding region 101 is increased to a certain degree, the P-MOS is turned on, and then a channel of the hole is formed at a sidewall close to the second trench unit 800. At this time, a large amount of holes in the N-type substrate 001 will reach the P-type source body region 202 along the channel and finally reach the emitter of MCBT, i.e., the second electrode 500. Different from ordinary IGBT, MCT and other devices, this hole channel is separated from the electron channel of the N-MOS, and the holes do not flow through the bottom of the N-type electron source region 303 in the P-type source body region 202. This prevents the parasitic transistor from turning on, thus effectively suppressing the occurrence of latch-up.

Third, the MCBT provided by the present invention has a small gate-collector capacitance ($C_{GC}$). The value of $C_{GC}$ is related to the ratio of the area of the P-type electric field shielding region 101 to the area of the cell. Since the P-type electric field shielding region 101 shields the electric field from the collector first electrode 502 and the N-type substrate 001, when the ratio of the area of the P-type electric field shielding region 101 to the area of the cell is large, the change of the collector potential mainly causes the change in the amount of charge in the P-type electric field shielding region 101, and only very few electric lines reach the gate region 011. Therefore, the charge in the gate region 011 becomes insensitive to the changes in the collector potential, which is reflected as a decrease in the gate-collector capacitance ($C_{GC}$).

Fourth, the MCBT provided by the present invention can provide a high breakdown voltage. The breakdown voltage is related to the ratio of the area of the P-type electric field shielding region 101 to the area of the cell. In the blocking state, a part of the negative charges generated by the ionized acceptor in the depleted P-type electric field shielding region 101 absorbs the positive charges generated by the ionized donor in the depleted N-type substrate 001, so that the electric field around the dielectric layer at the bottom of the first trench 700 and the second trench 800 is not easy to be concentrated, so a high blocking voltage can be obtained.

Fifth, the MCBT provided by the present invention has a good short-circuit resistance. In practical applications, power semiconductor devices may work in a short-circuit condition, wherein under high voltage and high current, the device self-heats so that the temperature exceeds the maximum junction temperature, which will cause failure. At a certain gate voltage, the short-circuit withstand capability of the device is directly related to the collector saturation current. The cell provided in Example 1 is provided with a floating P-type semiconductor region 203 outside the first trench unit 700 and the second trench unit 800. An appropriate collector saturation current can be obtained by adjusting the area ratio of the floating P-type semiconductor region 203 in the cell, so as to provide a good short-circuit resistance.

Sixth, the MCBT provided by the present invention has a low turn-off loss. In general, the anode of an ordinary IGBT continues to inject minority carriers during its turn-off process and thus a tailing current is generated. A large part of the power loss during the turn-off process is caused by the tailing current, and the size of the tailing current increases with the increase of injection efficiency of minority carriers in the anode. Since in the MCBT provided by the present invention the hole concentration is greatly increased on the side of the N-type carrier barrier region 010, the hole injection efficiency of the anode is allowed to be greatly reduced under the same on-voltage drop, so that the ratio of the electron current to the total current is increased and the tailing current is reduced, so a low turn-off loss can be obtained.

The semiconductor described in Example 1 may be of either a silicon (Si) material or a silicon carbide (SiC) material. The gate region 011 and the cathode region 111 may be of either a metal material or a polysilicon material. The first dielectric 012, the second dielectric 112, the third dielectric 015, and the fourth dielectric 016 may be of either a silicon dioxide material or other insulating materials.

Example 2

Figure 2:
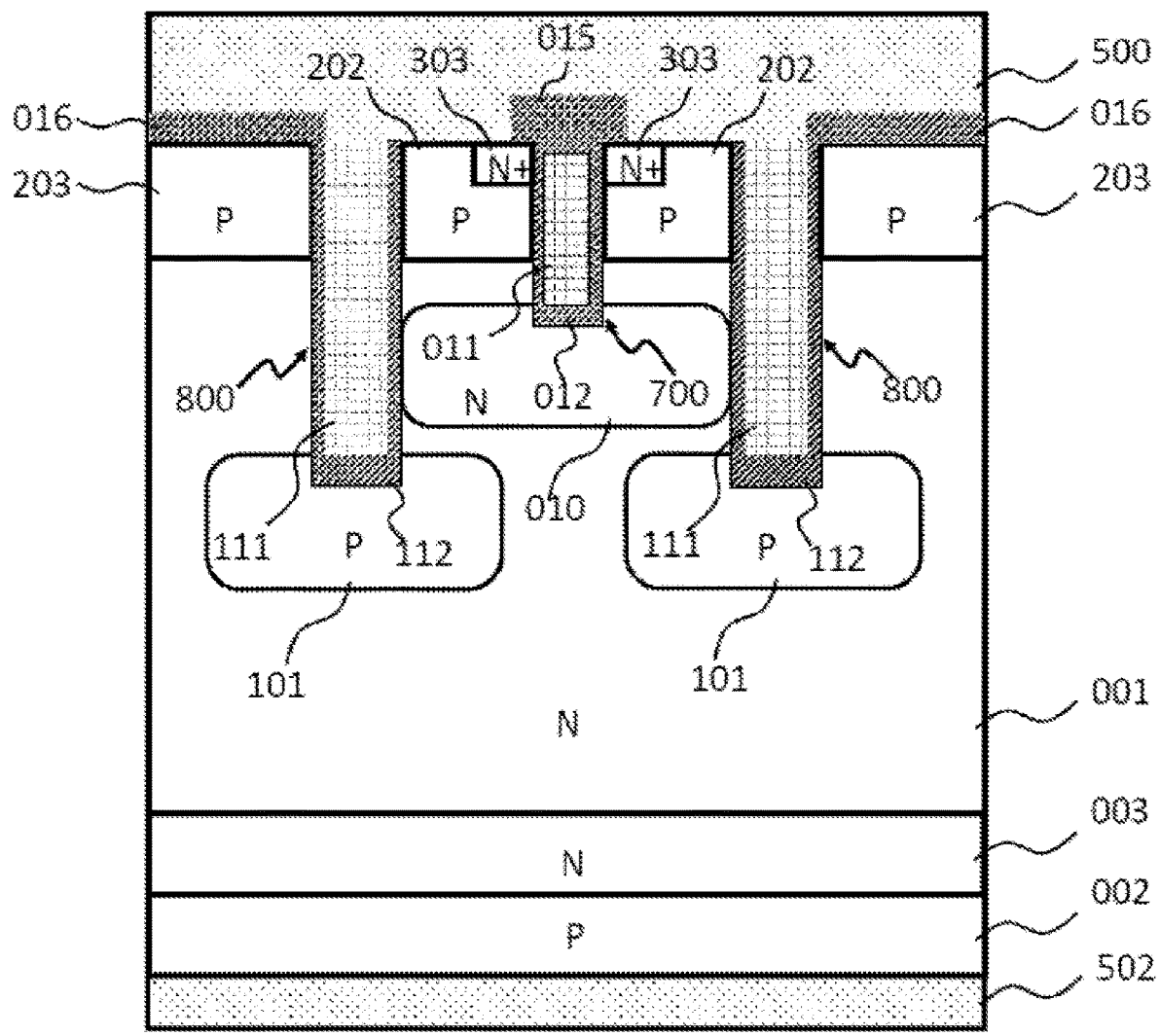
FIG. 2 is a schematic diagram of an embodiment of the present invention.

In the above embodiment, the N-type substrate 001 is a non-punch through substrate, that is, the N-type substrate region 001 will not be completely depleted when a maximum voltage is applied between the collector and the emitter. Example 2 provides a punch through cell or a field stop cell, whose structural is shown in FIG. 2. On the side adjacent to the P-type semiconductor region 002, there is a first N-type semiconductor region 003, which consists a field stop region. The doping concentration of the field stop region 003 is higher than that of the N-type substrate 001. When a maximum voltage is applied between the collector and the emitter, the electric field is stopped in the field stop region 003, and the field stop region 003 will not be completely depleted. The field-stop structure of Example 2 can provide a N-type substrate 001 with a smaller thickness than that in Example 1.

Since the thickness of the N-type substrate 001 is reduced, Example 2 can provide a smaller on-voltage drop ($V_{ON}$) than that in Example 1. Moreover, since the total amount of carriers in the N-type substrate 001 is in direct proportion to the thickness of the N-type substrate 001, the reduction of the thickness of the N-type substrate 001 also means reduction of the total amount of carriers. Therefore, at a certain current, the time required for the device to switch from the on-state to the off-state or from the off-state to the on-state is shorter, so Example 2 can provide a smaller switching loss than that of Example 1.

Example 3

Figure 3:
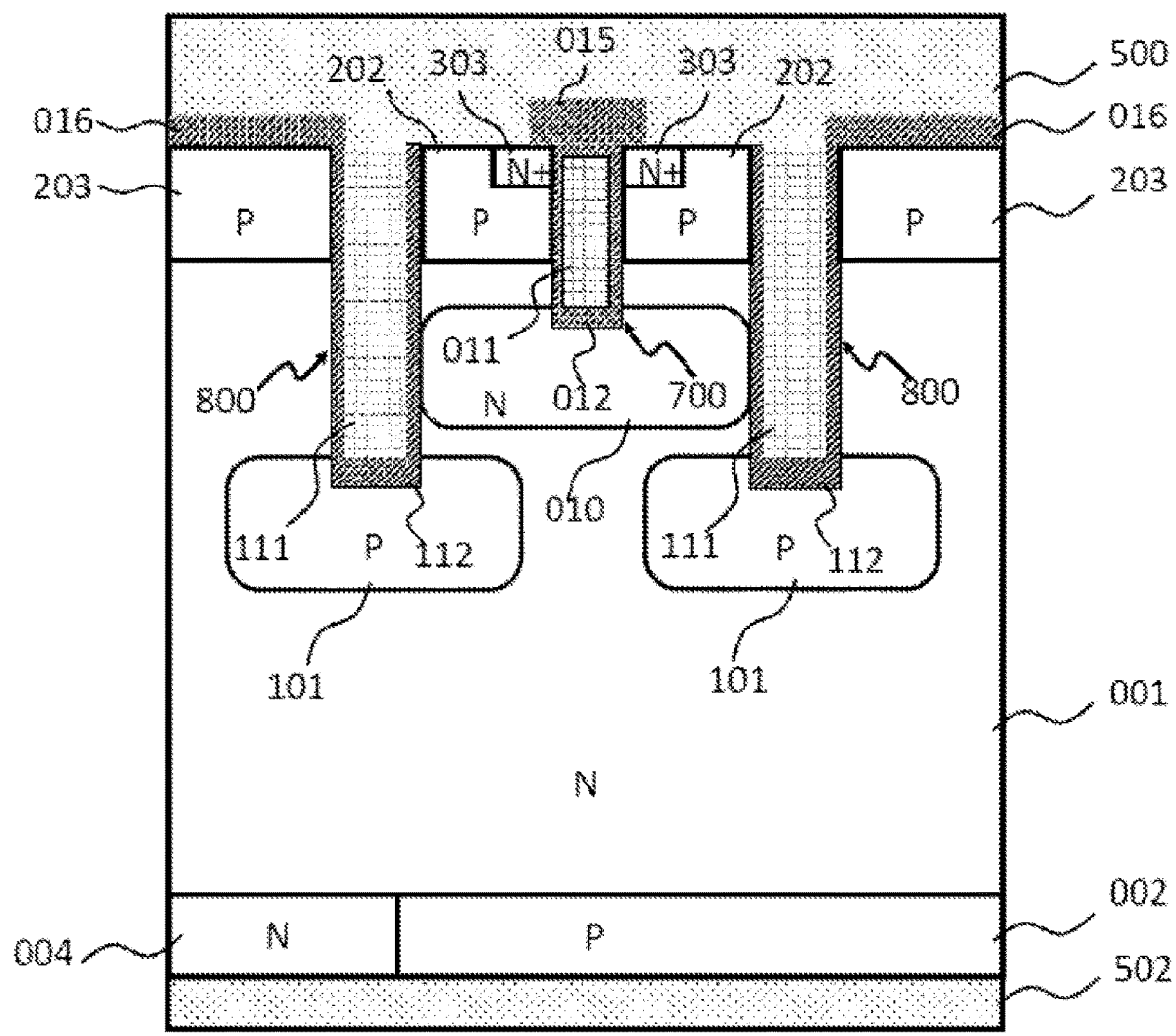
FIG. 3 is a schematic diagram of an embodiment of the present invention.

Example 3 provides a reverse conduction type cell with the structure shown in FIG. 3. On the side adjacent to the P-type semiconductor region 002, there is a second N-type semiconductor region 004. Both the P-type semiconductor region 002 and the second N-type semiconductor region 004 are in direct contact with the first electrode 502, forming an anode short structure.

A P-N-N diode is formed by the P-type source body region 202, the N-type carrier barrier region 010, the N-type substrate 001, and the second N-type semiconductor region 004. When the potential of the emitter second electrode 500 is higher than that of the collector first electrode 502, the P-N-N diode is forward biased. At this time, a current will flow from the emitter second electrode 500 to the collector first electrode 502 to form a reverse conductance.

Furthermore, since the anode injection efficiency is reduced due to the anode short circuit, Example 3 can provide a smaller turn-off loss than Example 1.

Figure 4:
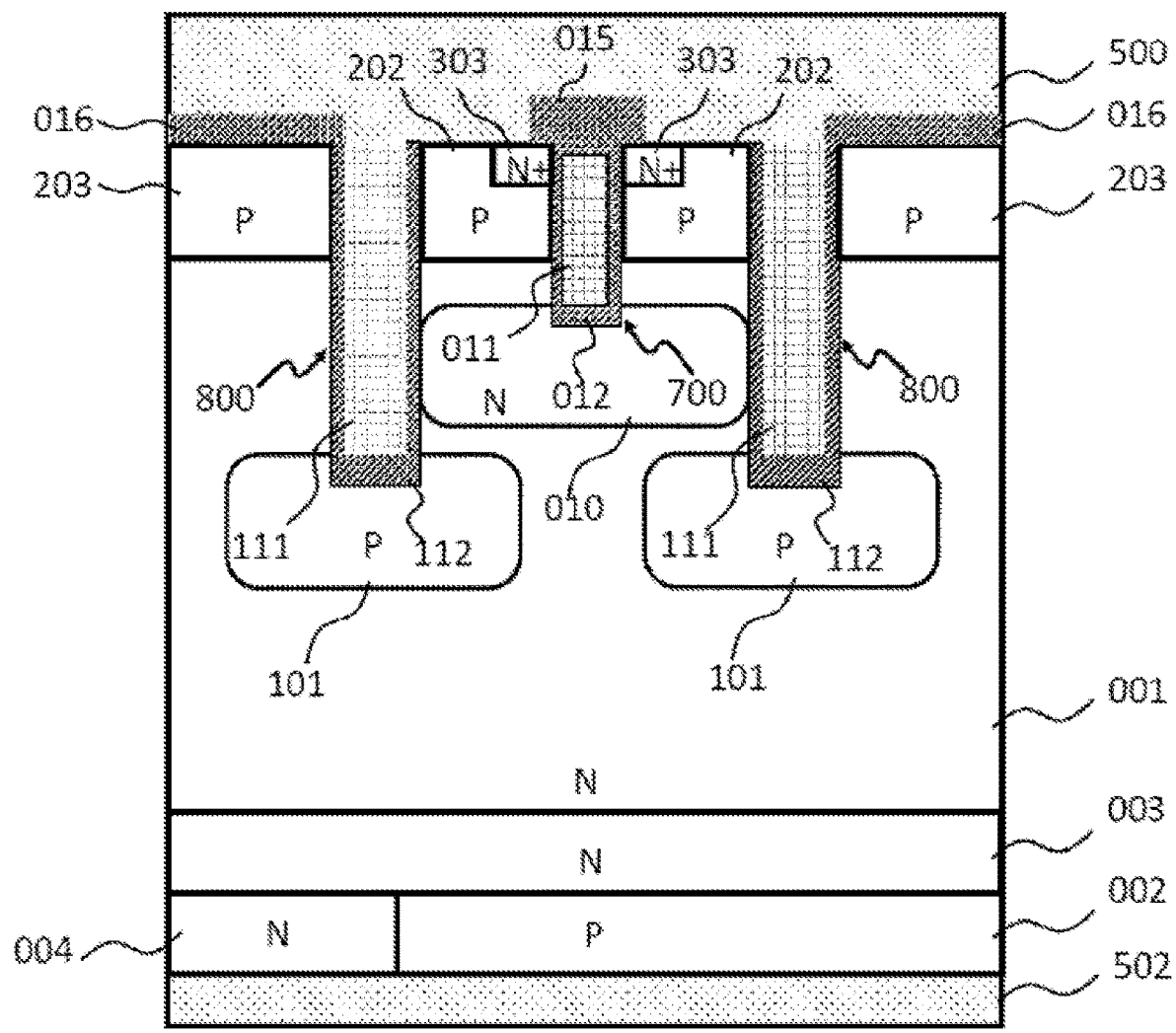
FIG. 4 is a schematic diagram of an embodiment of the present invention.

FIG. 4 is a schematic diagram of a cell structure in which a field stop region 003 is introduced on the basis of FIG. 3. Therefore, the structure shown in FIG. 4 has both the electrical characteristics described in FIG. 2 and FIG. 3, which will not be repeated here.

Unless specifically stated, the embodiments provided below are described by taking a non-punch through structure as an example, and cannot be interpreted in any way as a limitation on the scope of the present invention. The embodiments provided below are also applicable to a punch through or field stop or anode short structure.

Example 4

Figure 5:
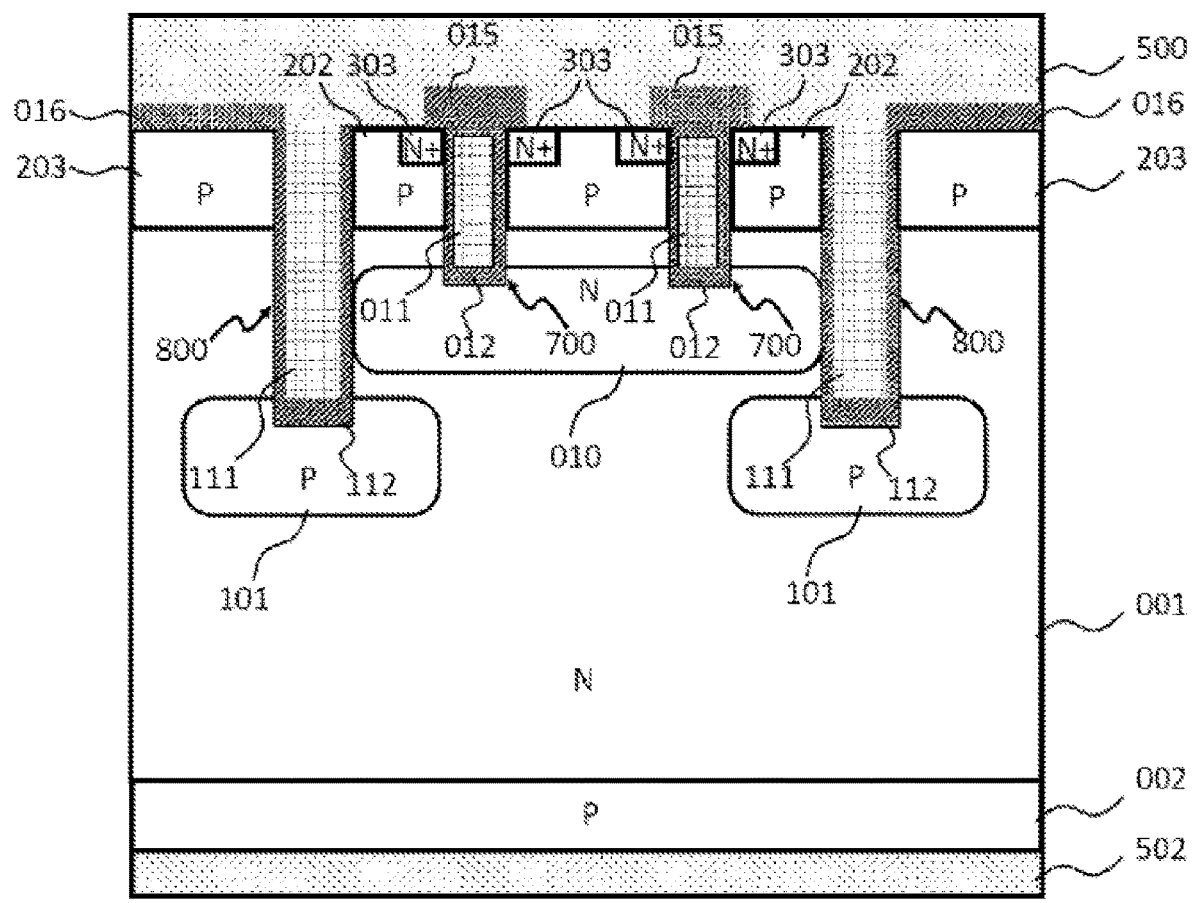
FIG. 5 is a schematic diagram of an embodiment of the present invention.

The cell structure of the MCBT provided in Example 4 may have a plurality of first trench units 700. A cell structure having two first trench units 700 is shown in FIG. 5. The plurality of first trench units 700 increase the effective channel width and further increase the current density.

Figure 6:
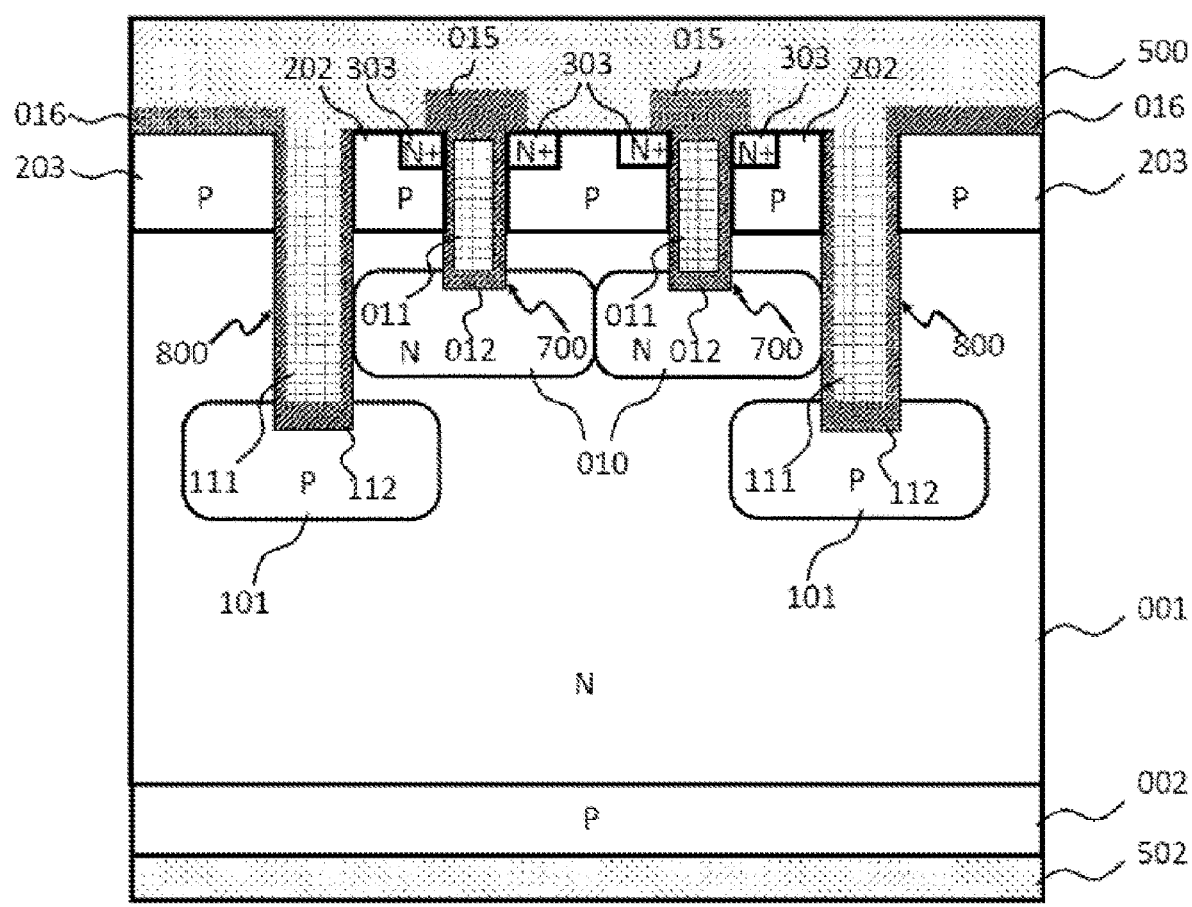
FIG. 6 is a schematic diagram of an embodiment of the present invention.

The bottoms of the two first trench units 700 shown in FIG. 5 share one N-type carrier barrier region 010, while the bottoms of the two first trench units 700 shown in FIG. 6 have respective N-type carrier barrier regions 010 and the two N-type carrier barrier regions 010 are in contact with each other.

Example 5

Figure 7:
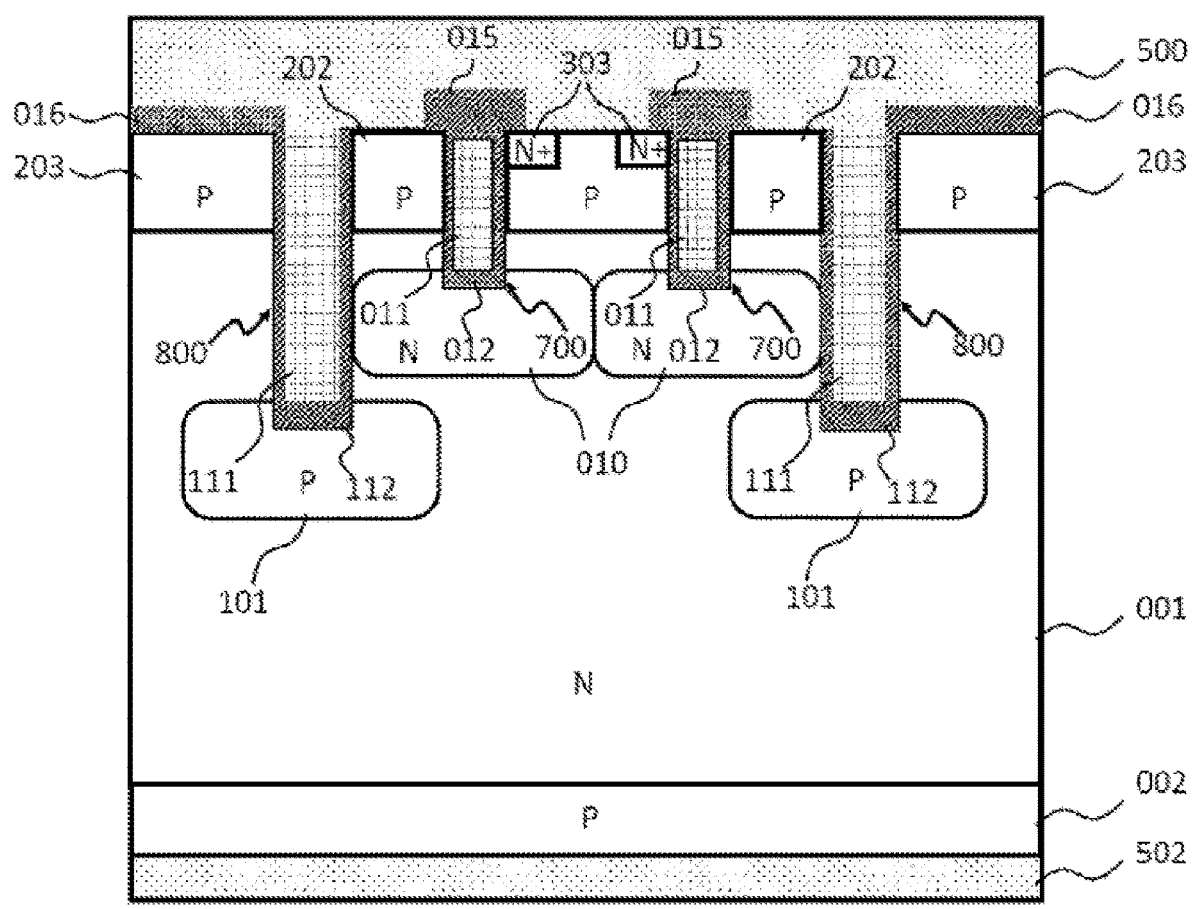
FIG. 7 is a schematic diagram of an embodiment of the present invention.

The cell structure of the MCBT provided in Example 5 may have a plurality of first trench units 700, and the N-type electron source regions 303 are on one side of the first trench unit 700, as shown in FIG. 7. Since the collector saturation current is directly proportional to the effective electron channel width of the N-MOS, and by comparison with the structure shown in FIG. 5, the effective electron channel width of the N-MOS in the embodiment provided in FIG. 7 is half that in FIG. 5, the collector saturation current of the embodiment provided in FIG. 7 is half that in FIG. 5, making it easy to improve the short-circuit withstand time of the device.

Example 6

Figure 8:
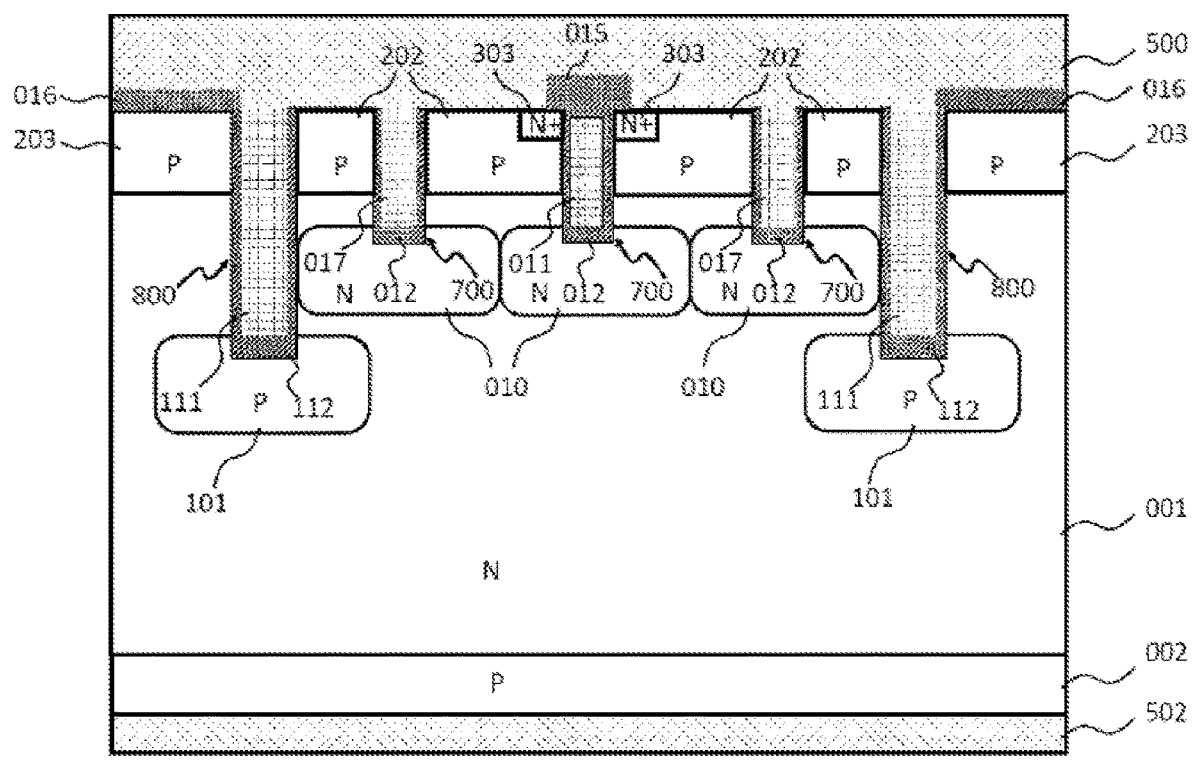
FIG. 8 is a schematic diagram of an embodiment of the present invention.

The cell structure of the MCBT provided in Example 6 may have a plurality of first trench units 700, wherein the first gates 017 of some of the first trench units 700 is in contact with the emitter second electrode 500, as shown in FIG. 8.

The cell structure shown in FIG. 8 has a stronger latch-up resistance than that of FIG. 1. Under high voltage and large current, a large amount of holes are injected from the P-type semiconductor region 002 into the N-type substrate 001 and reach the P-type electric field shielding region 101. The positively charged holes enter the P-type electric field shielding region 101 so that the potential of this region is increased. When the potential of the P-type electric field shielding region 101 is increased to a certain degree, the P-MOS, consisted by the P-type electric field shielding region 101, the second trench unit 800, the P-type source body region 202, and the N-type carrier barrier region 010, is turned on, and then a channel of the hole is formed at a sidewall close to the second trench unit 800. At this time, a large amount of holes in the N-type substrate 001 will reach the P-type source body region 202 along the channel and finally reach the emitter second electrode 500 of the MCBT. Different from the cell shown in FIG. 1, this hole channel is completely separated from the electron channel of the N-MOS, and thus the occurrence of latch-up is almost completely suppressed.

Example 7

Figure 9:
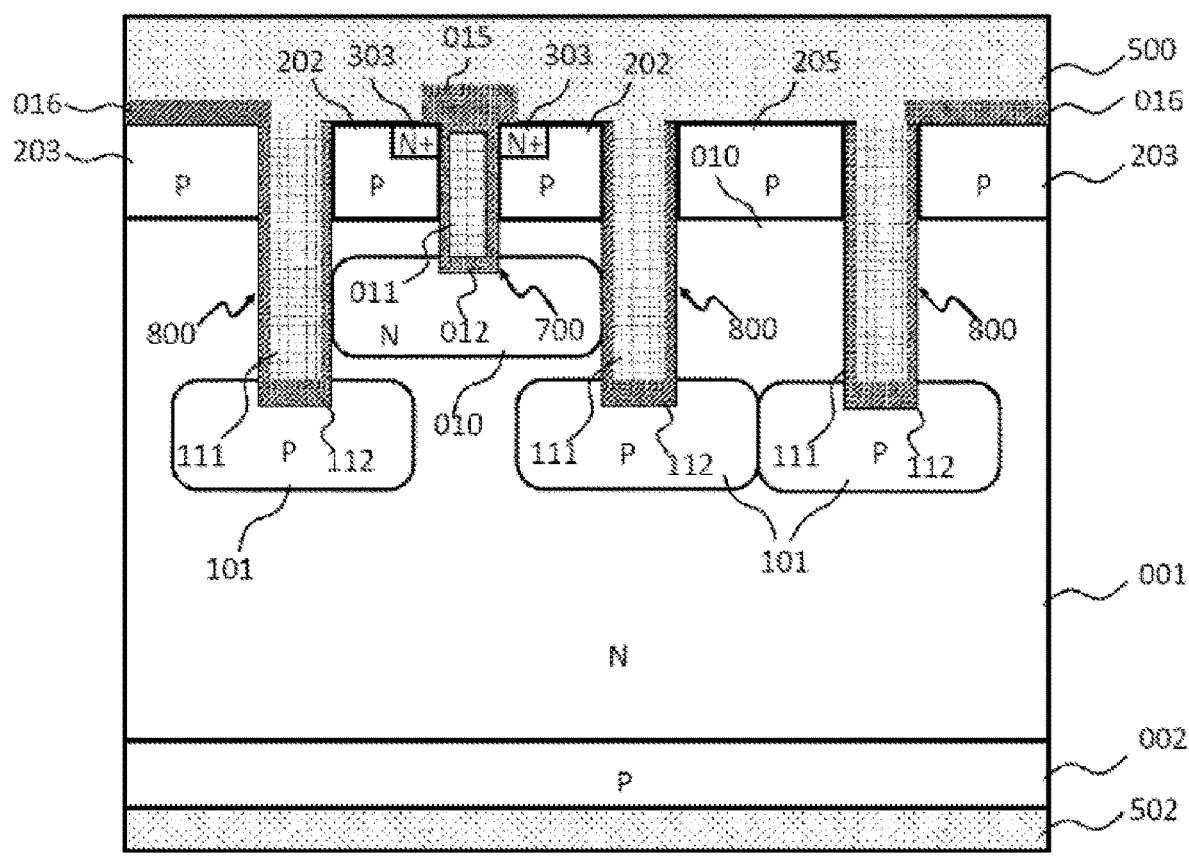
FIG. 9 is a schematic diagram of an embodiment of the present invention.

The cell structure of the MCBT provided in Example 7 may have a plurality of second trench units 800, as shown in FIG. 9. There is no first trench unit 700 and no N-type carrier barrier region 010 provided between the two second trench units 800 on the right in FIG. 9, and a P-MOS$_2$ is formed by the P-type electric field shielding region 101, the second trench unit 800, the P-type region 205, and a portion of the N-type substrate 001 surrounded by the two second trench units 800 on the right side, wherein the portion of the N-type substrate region 001 consists a source body region of the P-MOS$_2$. Since the doping concentration of the N-type substrate 001 is smaller than that of N-type carrier barrier region 010, P-MOS$_2$ has a smaller threshold voltage.

The cell structure shown in FIG. 9 has a stronger latch-up resistance than that of FIG. 1. This is because when holes are injected from the P-type semiconductor region 002 into the N-type substrate 001 and reach the P-type electric field shielding region 101, most of the hole current flows through the P-MOS$_2$ that has a smaller threshold voltage, and finally reaches the emitter second electrode 500 through the P-type region 205. Therefore, the hole channel is completely separated from the electron channel of the N-MOS, and the occurrence of latch-up is almost completely suppressed.

In addition, P-MOS$_2$ causes the potential of the P-type electric field shielding region 101 to be clamped (for example, if the threshold voltage of P-MOS$_2$ is 3V, then the potential of the P-type electric field shielding region 101 can be clamped within 10V under high voltage and large current). Therefore, the risk of breakdown of the dielectric layer of the second dielectric 112 is effectively reduced, and the reliability of the device is improved.

Example 8

Figure 10:
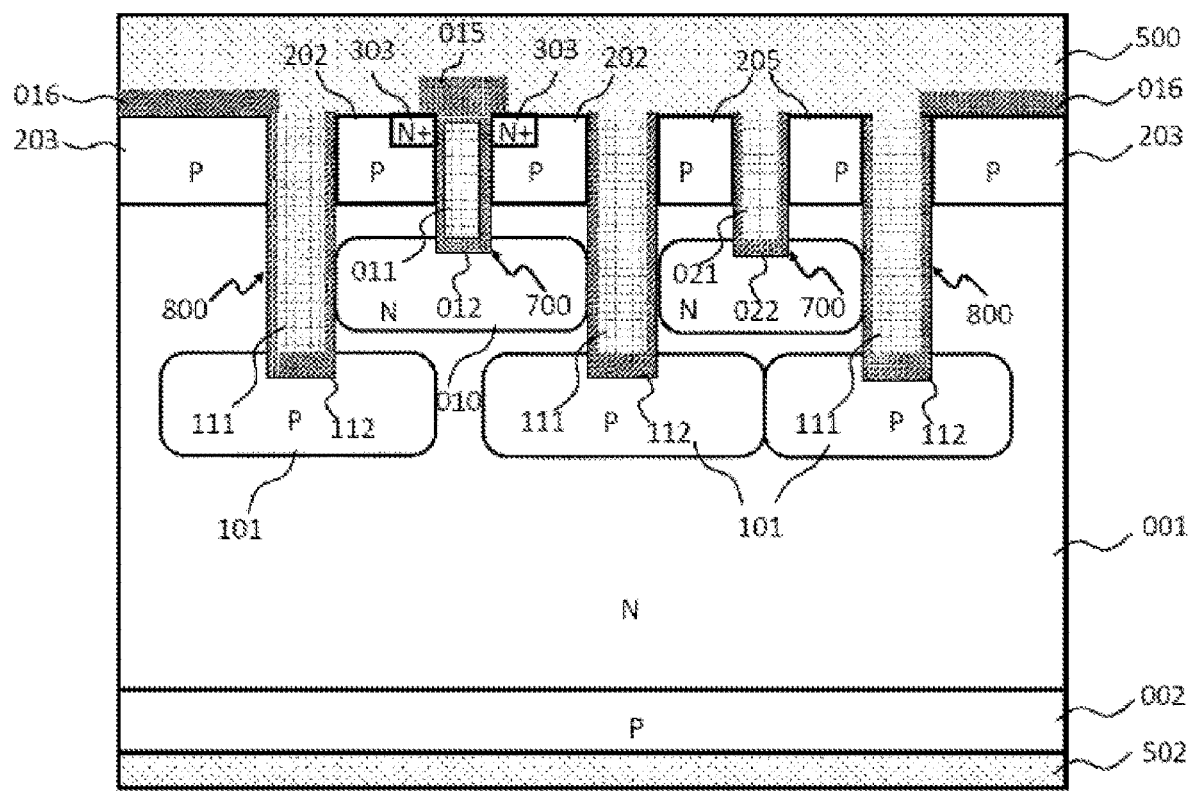
FIG. 10 is a schematic diagram of an embodiment of the present invention.

The cell structure of the MCBT provided in Example 8 may have a plurality of first trench units 700 and simultaneously have a plurality of second trench units 800. Among them, some of the first trench units 700 have a gate region 011 separated from the emitter second electrode 500 by a third dielectric 015, and some of the first trench units 700 have a second gate 021 connected with the emitter second electrode 500, as shown in FIG. 10. A P-MOS$_2$ is formed by the P-type electric field shielding region 101, the second trench unit 800, the P-type region 205, and the N-type carrier barrier region 010 surrounded by the two second trench units 800 on the right side. Since the threshold voltage of P-MOS$_2$ can be determined according to the concentration of the N-type carrier barrier region 010 near the second trench unit 800, the threshold voltage of the P-MOS$_2$ in FIG. 10 can be adjusted as required by the design.

Example 9

Figure 11:
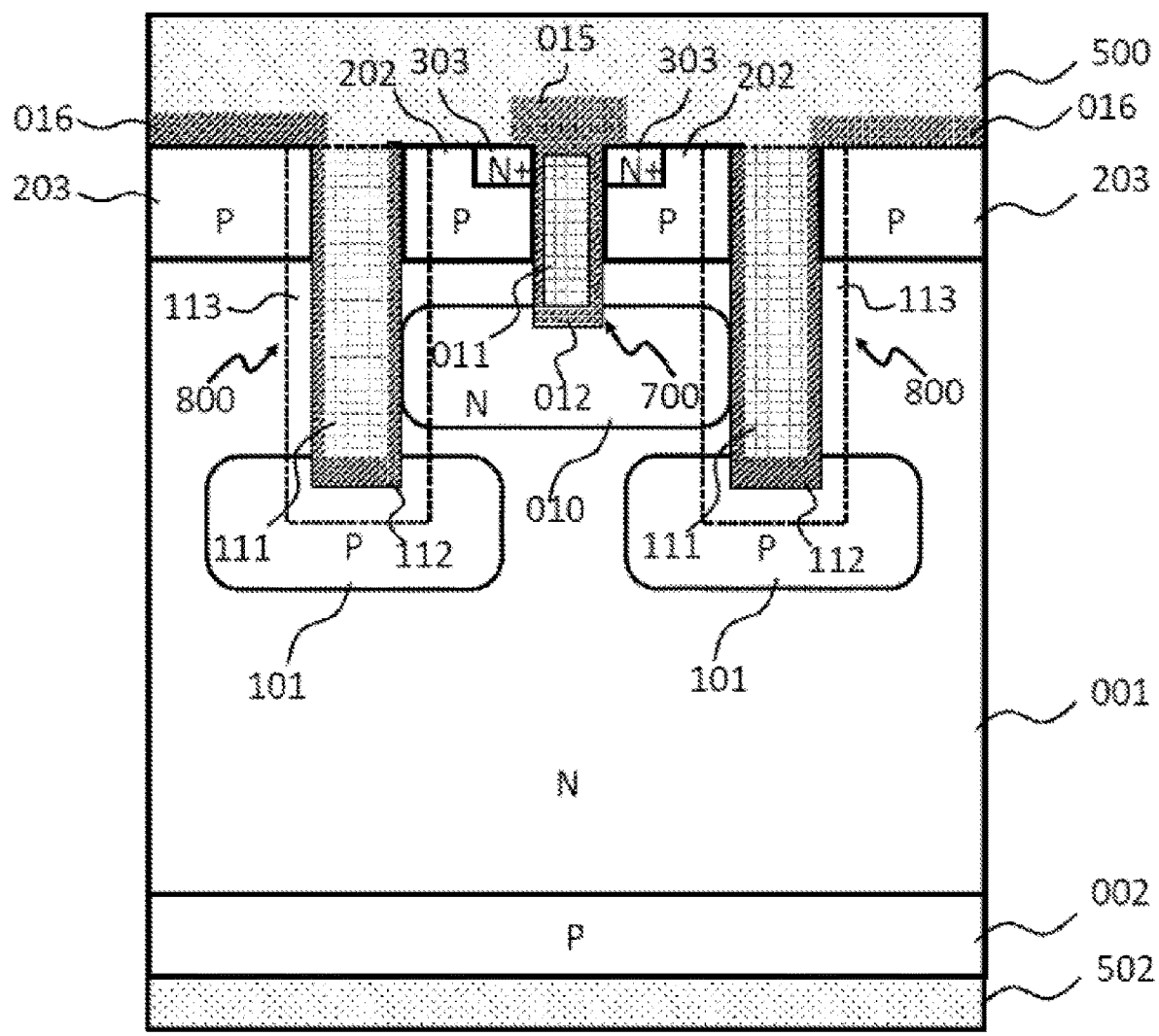
FIG. 11 is a schematic diagram of an embodiment of the present invention.

The second trench unit 800 in the above embodiment may be surrounded by a first P-type region 113, as shown in FIG. 11. The doped ions of the first P-type region 113 and the doped ions of the N-type carrier barrier region 010 near the second trench unit 800 are compensated, so that an adjustable threshold voltage of the P-MOS can be obtained.

Example 10

Figure 12:
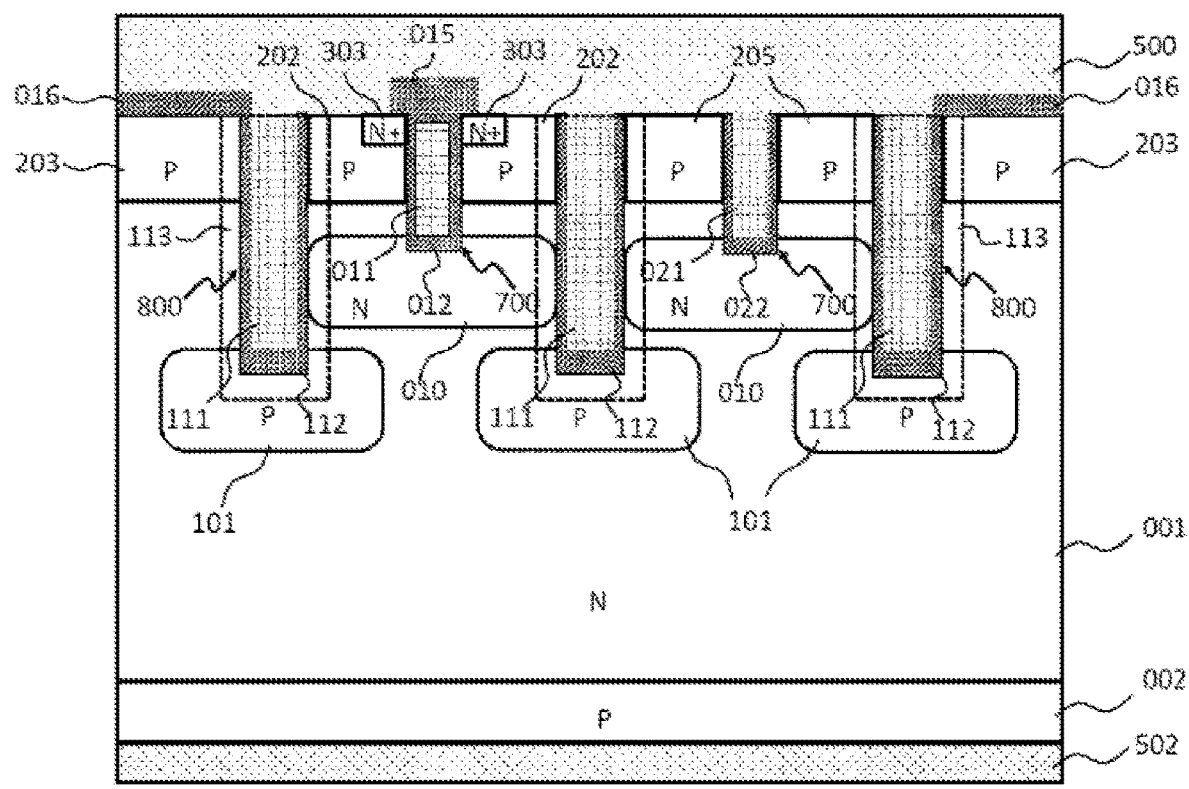
FIG. 12 is a schematic diagram of an embodiment of the present invention.

On the basis of Example 9, the cell structure of the MCBT provided in Example 10 may have a plurality of first trench units 700 and simultaneously have a plurality of second trench units 800. Among them, some of the first trench units 700 have a gate region 011 separated from the emitter second electrode 500 by a third dielectric 015, and some of the first trench unit 700 have a second gate 021 connected with the emitter second electrode 500, as shown in FIG. 12, wherein the second trench units 800 are surrounded by a first P-type region 113. The effective electron channel width of the N-MOS in the embodiment provided in FIG. 12 is half that of FIG. 11, so the collector saturation current of the embodiment provided in FIG. 12 is half that of FIG. 11, making it easy to improve the short-circuit withstand time of the device.

Example 11

Figure 13:
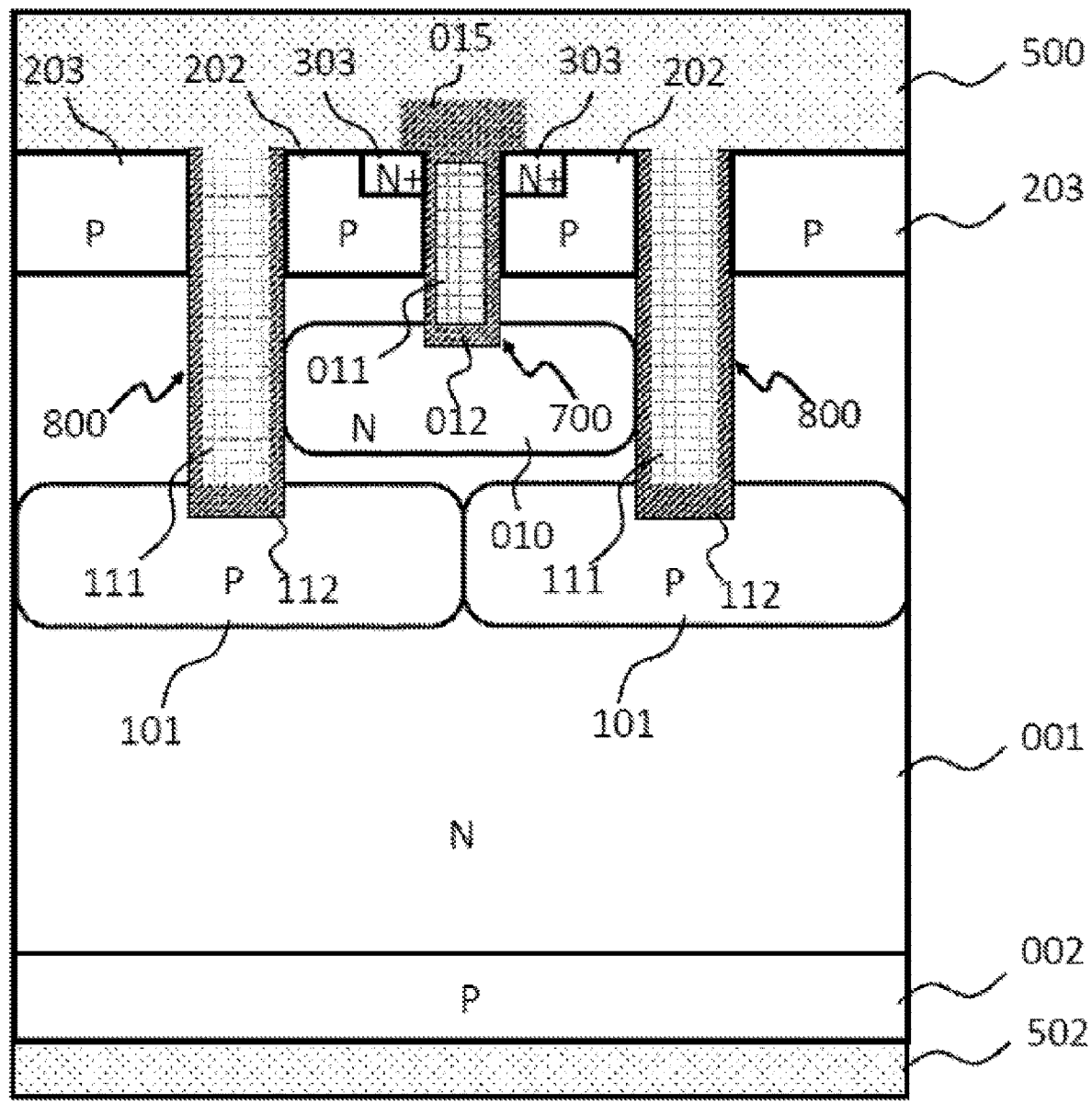
FIG. 13 is a schematic diagram of an embodiment of the present invention.

Example 11 provides another cell structure of MCBT, as shown in FIG. 13. The difference from the structure shown in FIG. 1 is that two adjacent P-type electric field shielding regions 101 are in contact.

The N-MOS formed by the first trench unit 700, and the P-type semiconductor region 002, the N-type substrate 001, the P-type electric field shielding region 101, and the N-type carrier barrier region 010 consist a PNPN shockley diode structure with MOS series. In this structure, the P-type electric field shielding region 101 and the N-type carrier barrier region 010 together form a barrier for the holes, so a lower on-voltage drop than the cell shown in FIG. 1 can be obtained.

Example 12

Figure 14:
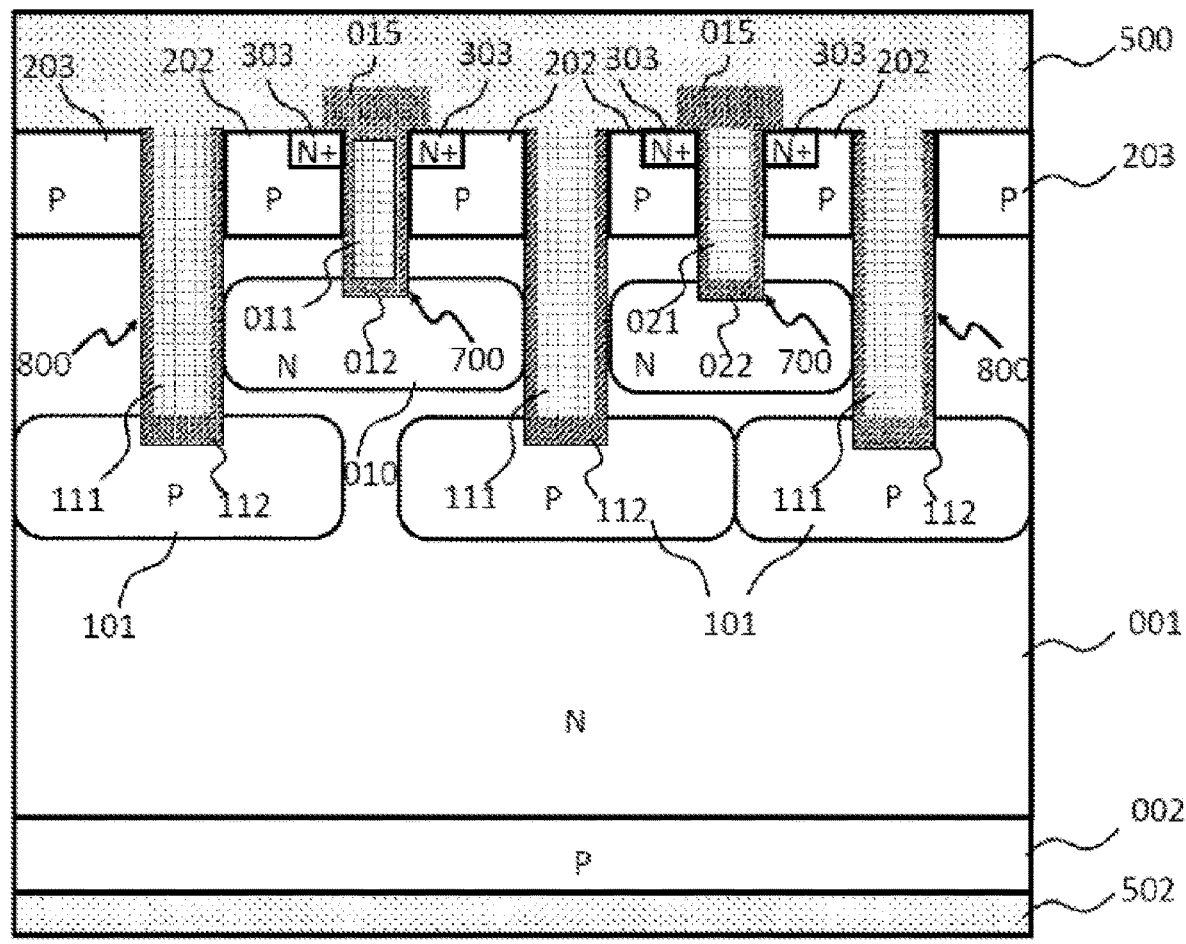
FIG. 14 is a schematic diagram of an embodiment of the present invention.

The PNPN shockley diode with MOS series provided in Example 11 requires additional triggering to turn on. For this reason, Example 12 provides a solution combining the cell structures shown in FIG. 1 and FIG. 13, as shown in FIG. 14. In FIG. 14, the P-type electric field shielding regions 101 at the bottom of the two second trench units 800 on the left side are not in direct contact, while the P-type electric field shielding regions 101 at the bottom of the two second trench units 800 on the right side are in contact.

Example 12 not only has the advantage of fast switching speed of the cell shown in FIG. 1, but also has the advantage of low on-voltage drop of the cell shown in FIG. 13.

Example 13

Figure 15:
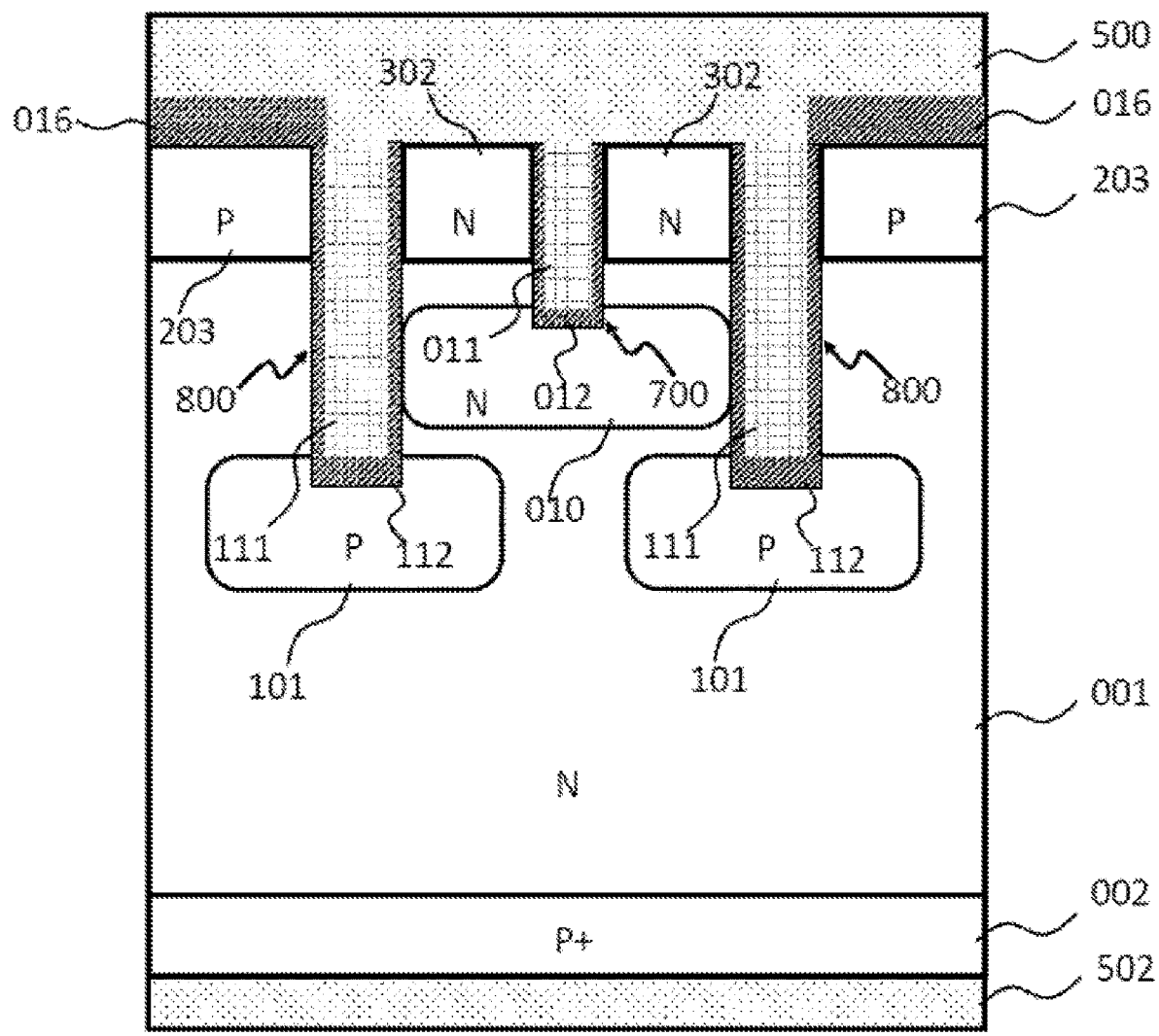
FIG. 15 is a schematic diagram of an embodiment of the present invention.

Example 13 provides a cell structure of a diode based on the present invention, as shown in FIG. 15. Different from the structure shown in FIG. 1, the gate region 011 of the first trench unit 700 is in contact with the emitter second electrode 500, and the N-type substrate 001 is provided with a third N-type semiconductor region 302 on a side adjacent to the emitter second electrode 500, with the third N-type semiconductor regions 302 being connected with the emitter second electrode 500. A PN diode is formed by the P-type semiconductor region 002, the N-type substrate 001, the N-type carrier barrier region 010, and the third N-type semiconductor region 302.

Example 14

Figure 16:
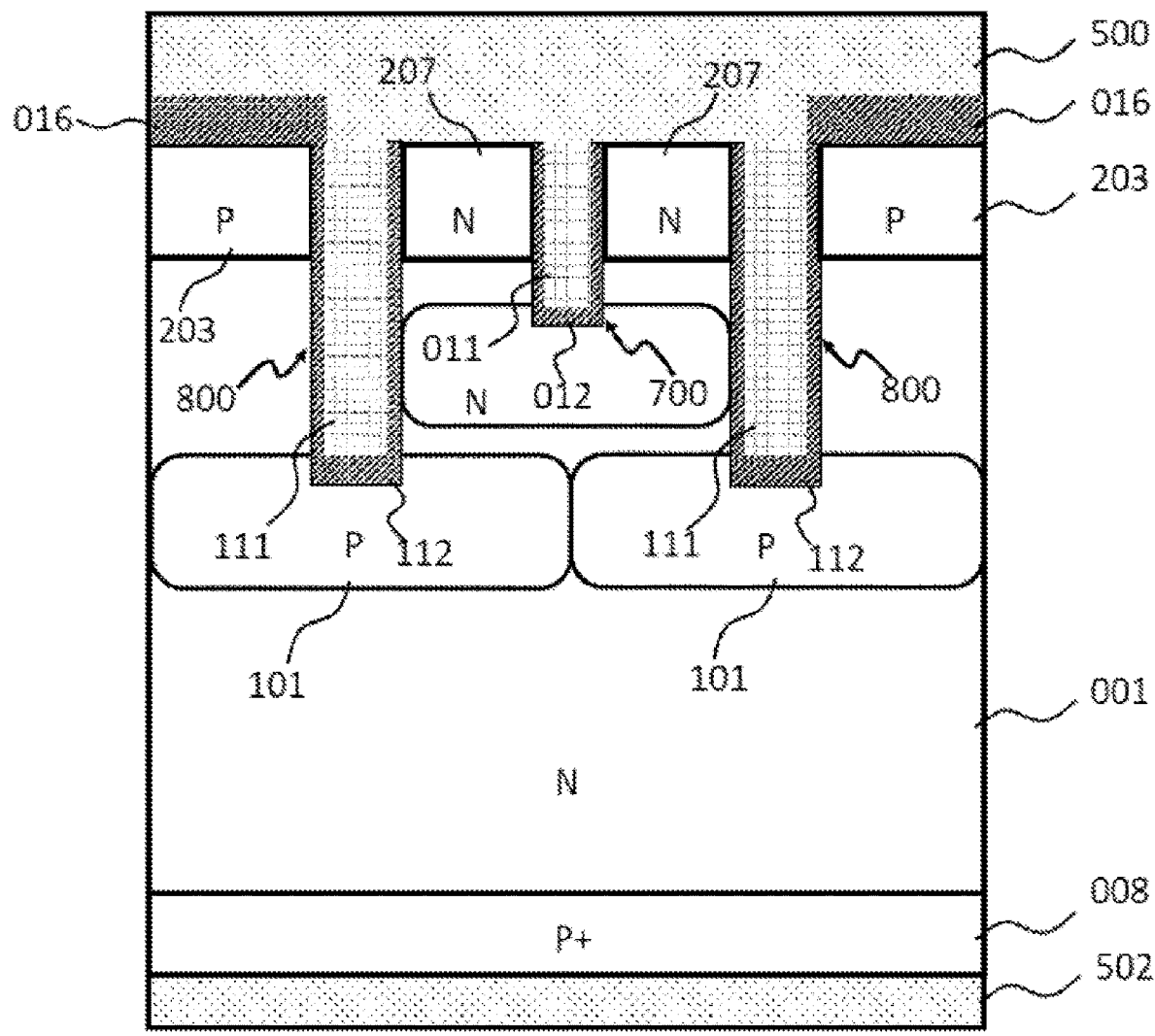
FIG. 16 is a schematic diagram of an embodiment of the present invention.

Example 14 provides a cell structure of a shockley diode based on Example 11 of the present invention, as shown in FIG. 16. Different from the structure shown in FIG. 13, the gate region 011 of the first trench unit 700 is in contact with the emitter second electrode 500, and the N-type region 207 is in contact with the first trench unit 700. A PNPN diode structure is formed by the P-type semiconductor region 002, the N-type substrate 001, the P-type electric field shielding region 101, the N-type carrier barrier region 010, and the N-type region 207.

Example 15

Figure 17:
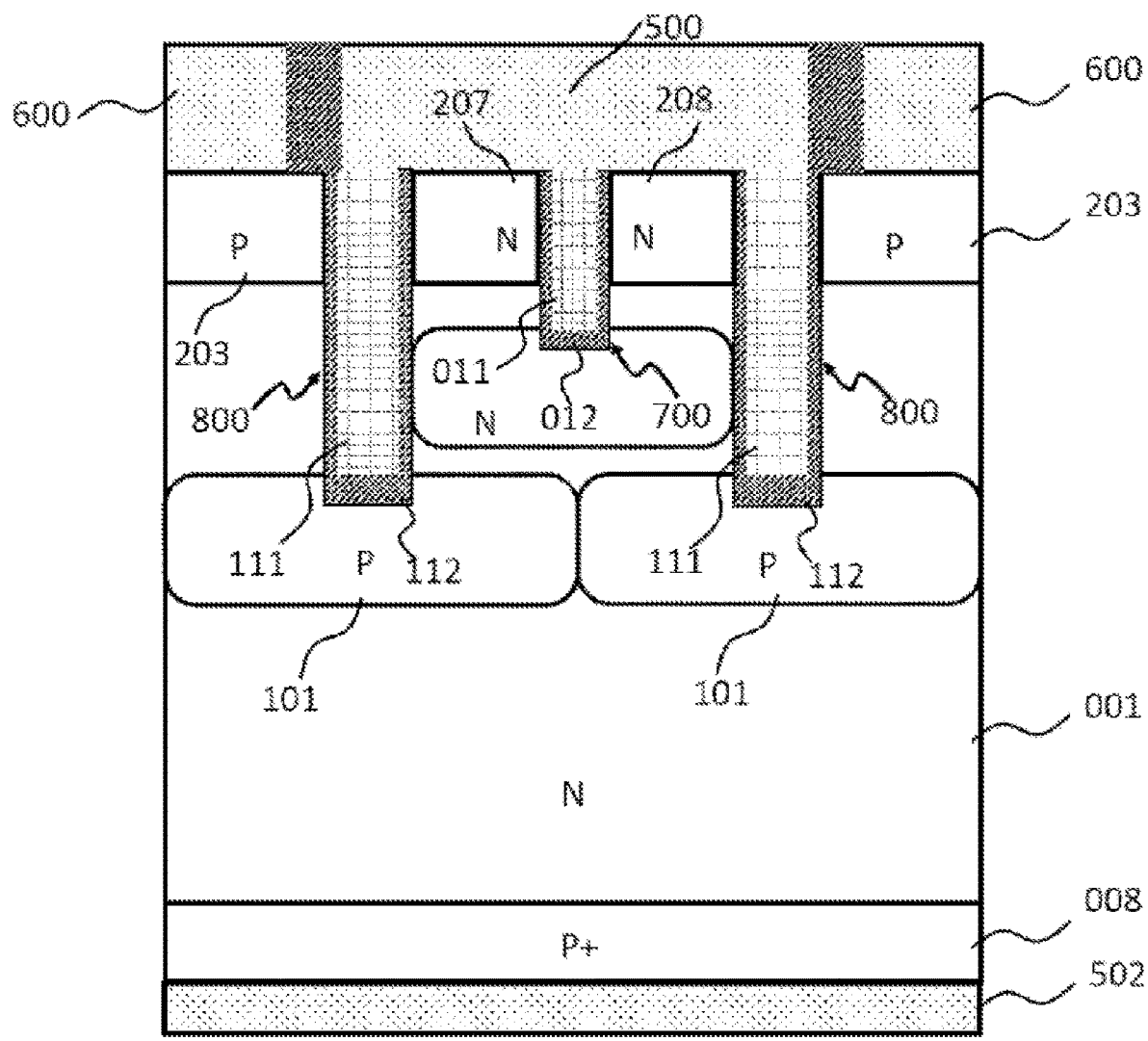
FIG. 17 is a schematic diagram of an embodiment of the present invention.

Example 15 provides a cell structure of a gate turn-off thyristor (GTO) based on Example 14 of the present invention, as shown in FIG. 17. Different from the structure shown in FIG. 16, the second trench unit 800 has no surface directly contacting the second electrode 500, and there is a conductor 600 directly contacting the floating P-type semiconductor region 203. The conductor 600 consists the gate of the GTO. By controlling the voltage of the conductor 600 with respect to the second electrode 500, the GTO can be controlled to be turned on and off.

Obviously, the N-type and P-type in the above description can be interchanged, and the corresponding electrons and holes can also be interchanged. The principle of the present invention is still applicable after the interchange.

The technical principles of the present invention have been described above with reference to specific embodiments. These descriptions are only intended for explaining the principle of the present invention, and cannot be interpreted in any way as limiting the scope of the present invention. Based on the explanation herein, those skilled in the art can associate other specific embodiments of the present invention without paying creative labor, and these embodiments will fall within the scope of the present invention.

What is claimed is:

1. A semiconductor device comprising at least one cell, each cell having a structure comprising:
- a N-type substrate;
- at least one first trench unit and at least one second trench unit provided on one side of the N-type substrate;
- at least one P-type semiconductor region provided on the other side of the N-type substrate, the P-type semiconductor region constituting an anode region;
- at least one N-type carrier barrier region having a doping concentration higher than that of the N-type substrate; and
- at least one P-type electric field shielding region; wherein the N-type carrier barrier region is provided with a surface in direct contact with the first trench unit, the N-type carrier barrier region is further provided with a surface in direct contact with the second trench unit, and the P-type electric field shielding region is provided with a surface in direct contact with the second trench unit;
- a gate region is provided within the first trench unit, with a first dielectric being provided between the gate region and semiconductor material for isolation, while a cathode region is provided within the second trench unit, with a second dielectric being provided between the cathode region and semiconductor material for isolation;
- the semiconductor device comprises at least one first electrode and at least one second electrode;
- the P-type semiconductor region is provided with a surface in direct contact with the first electrode;
- the cathode region is connected with the second electrode; and
- a third dielectric is provided between at least one gate region and the second electrode for isolation, this gate region consisting a third electrode of the semiconductor device;
- wherein at least one floating P-type semiconductor region is provided on a side of the N-type substrate, and a fourth dielectric is provided between the floating P-type semiconductor region and the second electrode for isolation.

2. The semiconductor device of claim 1, wherein the first trench unit may have a width equal to that of the second trench unit, or the first trench unit may have a width not equal to that of the second trench unit; and the first trench unit has a depth less than or equal to that of the second trench unit.

3. The semiconductor device of claim 1, wherein a first N-type semiconductor region is provided between the P-type semiconductor region and the N-type substrate, the N-type semiconductor region consisting a field stop region.

4. The semiconductor device of claim 1, wherein the N-type substrate is connected with the first electrode through a second N-type semiconductor region.

5. The semiconductor device of claim 1, wherein the cell comprises two or more first trench units, and at least one first gate or second gate is connected with the second electrode.

6. The semiconductor device of claim 1, wherein the cell comprises two or more second trench units, and at least two P-type electric field shielding regions are in contact with each other.

7. The semiconductor device of claim 1, wherein the semiconductor device is a MOS-controlled bipolar transistor, and a P-type source body region is provided between the first trench unit and the second trench unit;
- the P-type source body region is provided with at least one N-type electron source region on a side adjacent to the first trench unit;
- at least a part of the P-type source body region and a part of the N-type electron source region are connected with the second electrode; and
- the first trench unit, the N-type carrier barrier region, the P-type source body region, and the N-type electron source region constitute a MOS structure.

8. The semiconductor device of claim 7, wherein the semiconductor device is a MOS controlled thyristor.

9. The semiconductor device of claim 7, wherein the semiconductor device is a diode.

10. The semiconductor device of claim 7, wherein the semiconductor device is a Shockley diode.

11. The semiconductor device of claim 7, wherein the semiconductor device is a thyristor whose gate can be turned off.

12. The semiconductor device of claim 1, wherein the N-type and P-type are interchangeable.

* * * * *